United States Patent
Falk et al.

(10) Patent No.: US 11,035,785 B1
(45) Date of Patent: Jun. 15, 2021

(54) HYBRID FIELD EFFECT TRANSISTOR AND SURFACE ENHANCED INFRARED ABSORPTION BASED BIOSENSOR

(71) Applicant: INTERNATIONAL BUSINESS MACHINES CORPORATION, Armonk, NY (US)

(72) Inventors: Abram L. Falk, Port Chester, NY (US); Sufi Zafar, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/716,971

(22) Filed: Dec. 17, 2019

(51) Int. Cl.
| | |
|---|---|
| G01N 21/35 | (2014.01) |
| H01L 31/113 | (2006.01) |
| H01L 31/11 | (2006.01) |
| H01L 27/144 | (2006.01) |
| H01L 31/028 | (2006.01) |

(52) U.S. Cl.
CPC ......... *G01N 21/35* (2013.01); *H01L 27/1443* (2013.01); *H01L 27/1446* (2013.01); *H01L 31/028* (2013.01); *H01L 31/1105* (2013.01); *H01L 31/1136* (2013.01); *G01N 2021/3595* (2013.01)

(58) Field of Classification Search
CPC ............ G01N 21/35; G01N 2021/3595; H01L 27/1443; H01L 31/1105; H01L 31/028; H01L 31/1136; H01L 27/1446
USPC ................................................... 250/339.08
See application file for complete search history.

(56) References Cited

U.S. PATENT DOCUMENTS

| | | | |
|---|---|---|---|
| 8,828,138 B2 | 9/2014 | Bedell | |
| 8,994,077 B2 | 3/2015 | Afzali-Ardakani | |
| 8,999,739 B2 | 4/2015 | Afzali-Ardakani | |
| 9,110,014 B2 | 8/2015 | Afzali-Ardakani | |
| 9,201,041 B2 | 12/2015 | Dalton | |

(Continued)

FOREIGN PATENT DOCUMENTS

| | | |
|---|---|---|
| CN | 103884759 A | 6/2014 |
| CN | 102313769 B | 12/2014 |
| KR | 20110126545 A | 11/2011 |

OTHER PUBLICATIONS

Falk et al., "Coherent Plasmon and Phonon-Plasmon Resonances in Carbon Nanotubes", Physical Review Letters, PRL 118, 257401 (2017), week ending Jun. 23, 2017, pp. 1-6.

(Continued)

*Primary Examiner* — David P Porta
*Assistant Examiner* — Gisselle M Gutierrez
(74) *Attorney, Agent, or Firm* — L. Jeffrey Kelly

(57) ABSTRACT

A semiconductor structure, the semiconductor structure including a channel connecting a source on the semiconductor substrate and a drain on the semiconductor substrate, wherein the channel comprises a plasmonic resonator. A sensor including a plasmonic film, wherein the plasmonic film includes a sensitivity to a known analyte, a semiconductor structure including a source and a drain of a field effect transistor, and an electrical connection between the plasmonic film and a gate of the semiconductor structure. A method of forming a sensor including forming a field effect transistor ("FET") on a semiconductor substrate, the field effect transistor including a source, a drain, and a gate, where the gate includes a plasmonic resonator.

20 Claims, 10 Drawing Sheets

(56) References Cited

U.S. PATENT DOCUMENTS

| | | | |
|---|---|---|---|
| 9,216,421 B2 | 12/2015 | Gordon | |
| 9,368,667 B1 | 6/2016 | Kim | |
| 9,714,952 B2 | 7/2017 | Feller | |
| 10,209,186 B2 | 2/2019 | Afzali-Ardakani | |
| 10,340,459 B2 | 7/2019 | Falk | |
| 2006/0054941 A1 | 3/2006 | Lu | |
| 2009/0065801 A1* | 3/2009 | Conway | H01L 29/7373 257/104 |
| 2010/0053624 A1 | 3/2010 | Yoo | |
| 2010/0204676 A1 | 8/2010 | Cardullo | |
| 2014/0027871 A1* | 1/2014 | Cai | H01L 31/035272 257/431 |
| 2014/0030838 A1* | 1/2014 | Cai | H01L 27/14 438/49 |
| 2014/0327446 A1 | 11/2014 | Bedell | |
| 2014/0358128 A1* | 12/2014 | Montazeri | A61M 31/002 604/890.1 |
| 2015/0253438 A1* | 9/2015 | Cai | H01L 31/118 250/370.05 |
| 2015/0295119 A1* | 10/2015 | Cai | H01L 31/022408 257/429 |
| 2016/0011216 A1* | 1/2016 | Feller | G01N 27/4145 436/501 |
| 2016/0041159 A1* | 2/2016 | Labaer | G01N 33/54373 506/9 |
| 2016/0123973 A1* | 5/2016 | Cubukcu | G01N 21/554 506/9 |
| 2017/0227556 A1* | 8/2017 | Feller | G01N 21/553 |
| 2018/0188171 A1* | 7/2018 | Afzali-Ardakani | G01N 21/554 |
| 2019/0137392 A1* | 5/2019 | Afzali-Ardakani | G01N 21/554 |
| 2019/0257843 A1* | 8/2019 | Feller | G01N 21/553 |
| 2019/0257844 A1* | 8/2019 | Feller | G01N 33/5438 |

OTHER PUBLICATIONS

Zafar et al., "Comparison between Field Effect Transistors and Bipolar Junction Transistors as Transducers in Electrochemical Sensors", Scientific Reports, 7:41430 | DOI: 10.1038/srep41430, p. 1-10.

Zafar et al., "A comparison between bipolar transistor and nanowire field effect transistor biosensors", Applied Physics Letters 106, 063701 (2015); doi: 10.1063/1.4907611, Published by the AIP Publishing, pp. 1-5.

Mell et al., "The NIST Definition of Cloud Computing", National Institute of Standards and Technology, Special Publication 800-145, Sep. 2011, pp. 1-7.

Pending application No. PCT/IB2020/061377, Filed on Dec. 2, 2020, entitled: "Hybrid Sensor Including Plasmonic Resonator", 31 pages.

* cited by examiner

Section A-A*

HYBRID FIELD EFFECT TRANSISTOR AND SURFACE ENHANCED INFRARED ABSORPTION BASED BIOSENSOR

BACKGROUND

The present invention generally relates to a sensor, and more specifically to a multi-modal sensor combining electrical and optical sensors.

Sensing of chemical and biological elements can be used for health monitoring and environmental monitoring. Health monitoring is important for evaluation and assistance for personal health needs of people for personal use or in a health care facility. Monitoring of chemical and biological elements in the environment is important for environmental safety monitoring and security concerns. It is desirable to have sensors with high sensitivity to such elements, and also to transmit the sensed information remotely, by wired or wireless means, to a distant monitoring point.

SUMMARY

According to an embodiment of the present invention, there is a semiconductor structure provided. The semiconductor structure includes a channel connecting a source on the semiconductor substrate and a drain on the semiconductor substrate, wherein the channel comprises a plasmonic resonator.

According to another embodiment, a sensor is provided. The sensor includes a plasmonic film, wherein the plasmonic film includes a sensitivity to a known analyte, a semiconductor structure including a source and a drain of a field effect transistor, and an electrical connection between the plasmonic film and a gate of the semiconductor structure.

According to another embodiment, a method of forming a sensor is provided. The method includes forming a field effect transistor ("FET") on a semiconductor substrate, the field effect transistor including a source, a drain, and a gate, where the gate includes a plasmonic resonator.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
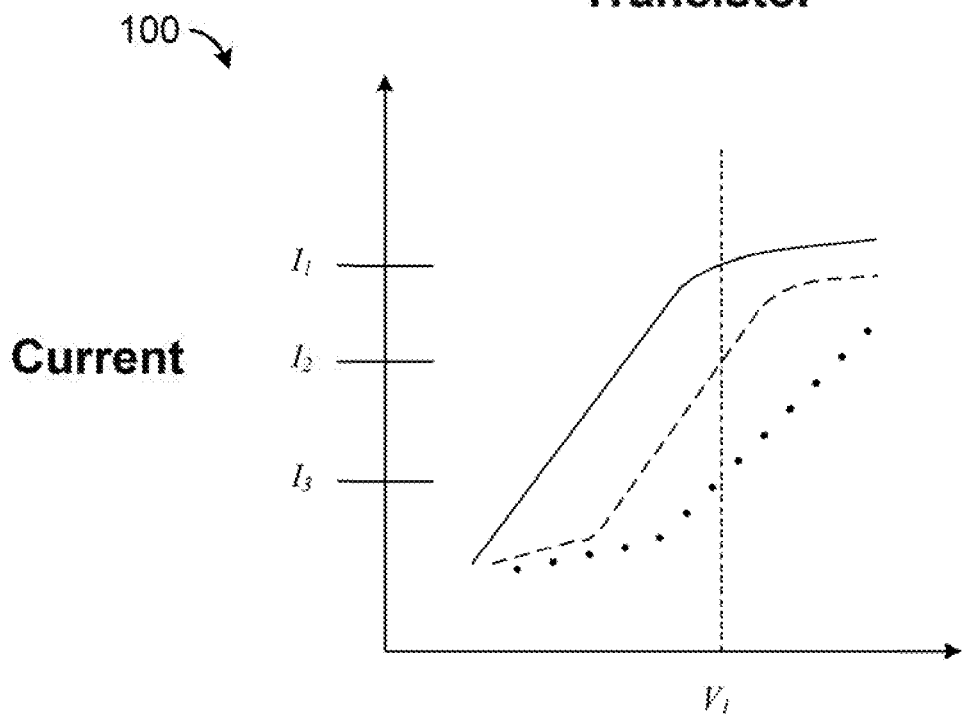
FIG. 1 illustrates a graph according to an embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Embodiments of the present invention relate to sensors, and more particularly to a multi-modal sensor combining an electrical sensor and an optical sensor. The following described exemplary embodiments provide a system, method, and program product to, among other things, combine speed and sensitivity of an electrical sensor with chemical sensitivity of an optical sensor by using a material which has a dual use as a channel of the electrical sensor and as a plasmonic resonator. The embodiments of the present invention have the capacity to improve the technical fields of both medical testing and environmental monitoring.

As previously described, health or medical monitoring is important for evaluation and assistance for personal health needs of people for personal use or in a health care facility. Monitoring of chemical and biological elements in the environment is important for environmental safety monitoring and security concerns. It is desirable to have sensors with high sensitivity to such elements, and also to transmit the sensed information remotely, by wired or wireless means, to a distant monitoring point.

Bioanalytic sensors are useful for health evaluations and health monitoring. Examples of analytes which may be used in health evaluations include glucose, cholesterol, calcium, blood count and vitamin levels.

Environmental sensors are useful to monitor air quality and can be used for leak detection and monitoring hazardous pollutants. This can help protect the environment and human health. Examples of analytes which may be sensed in an environment include different types of gas, such as methane, carbon dioxide, hydrogen chloride, pH value, carbon monoxide or explosive gases.

A wireless digital sensor can send information electronically from one location to another location. The information can be stored for comparison between locations and over a period of time.

An electrical sensor may use changes in charges, current or voltage for sensing. The charge on the sensing surface may result in a change in a current between a source and a drain of a Field Effect Transistor (hereinafter "FET") of the electrical sensor. In an embodiment, an electrical sensor may use one or more Field Effect Transistors (hereinafter "FET"s). Alternatively, an electrical sensor may use one or more Bipolar Junction Transistors (hereinafter "BJT"s). FET sensors are sensitive to charges (Q) on a sensing surface. The sensing surface can be a gate dielectric surface or gate electrode. Ions and many biomolecules (proteins, exosomes, viruses) have charges on them. When the ion or biomolecule bind to the sensing surface, this causes a surface potential to change, which in turn causes a sensing current to change. Specificity is achieved by functionalizing sensing surface such that only a target analyte would bind to it. The sensing surface may become more conductive or less conductive as a result of the analyte or reactant. Advantages of using an electrical sensor include speed and sensitivity.

An optical sensor uses Fourier-transform infrared spectroscopy (hereinafter "FTIR") to measure a range of wavelengths in the infrared region which are absorbed by a material under test. A broadband light source passes through an interferometer, through a sample, to an infrared detector which measures a range of wavelengths in the infrared region that are absorbed by the sample or device under test. The infrared absorption wavelength bands identify molecular components and structures in the sample to identify the analyte present in the sample. Molecules can be sensitively and specifically identified and probed by their infrared spectrum of molecular vibrations/rotations. The FTIR can identify a concentration of the analyte present in the sample.

When a molecule is close to (typically with tens of nanometers from) a plasmonic resonator/antenna, its absorption can be radically enhanced due to the Purcell effect arising from the high concentration of optical modes near the resonator. In the infrared, this effect is called surface-enhanced infrared absorption (SEIRA) and is similar to the well-known surface enhanced Raman scattering (SERS) effect. When using SEIRA, an optical field is spatially concentrated by a plasmonic resonance at a molecule, thereby enhancing the absorption of that molecule.

Plasmonic resonators can be made out of both metals and highly doped semiconductors, and can include low-dimensional materials. Low-dimensional materials are materials which have a low enough charge density that electrical fields are not screened. Their resonant frequency is a function of material, geometry, and charge density.

In an embodiment, a material for the multi-modal sensor can be selected which has a dual role as a semiconductor material for the electrical sensor and as a good plasmonic resonator for the optical sensor. Material characteristics required for the semiconductor material include good transistor channel material, high mobility, low charge density and low dimensionality such that electrical fields are not screened. Material characteristics required for a plasmonic resonator include a material that functions as a good optical cavity, low optical loss, low dimensionality, and has a correct charge density. The correct charge is such that the plasmonic resonator has a response in the infrared region. The material can be specifically manufactured as a good plasmonic resonator for a specific molecule or analyte.

In an embodiment, the material may include silicon, carbon nanotubes and graphene. Each of these materials can have the dual role as a channel material for an FET in the electrical sensor and as a plasmonic resonator. Using the material as a channel material for the FET allows an optical field to be concentrated by its plasmonic resonator characteristics.

Graphene, which is a two-dimensional crystal of carbon atoms, can be used for gas, chemical and biosensors. Carbon nanotubes are rolled up graphene sheets. Due to their large surface-to-volume ratio and electronic sensitivity to surface molecules, graphene and carbon nanotubes can be used for sensing an analyte, such as an environment material. The electronic sensitivity of graphene and carbon nanotubes can be manifested as a change in their resistance and conductance when molecules are absorbed from the environment. Graphene can be treated, functionalized, or engineered to detect specific molecules or analytes. Graphene and carbon nanotubes can be used for sensing analytes and to provide a digital signal.

One method of fabricating sensors is described in detail below by referring to the accompanying drawings in FIGS. 1 to 10, in accordance with an illustrative embodiment.

Referring now to FIG. 1, a graph 100 according to an exemplary embodiment is shown. Graph 100 shows current as a function of a gate voltage between a source and drain of a field effect transistor (hereinafter "FET") sensor fabricated with a graphene or carbon nanotube gate channel which has a sensitivity to a specific analyte. As shown in the graph 100, as the gate voltage of the FET between a source and a drain increases, the current increases between the source and drain of the FET. The solid line in the graph 100 shows an operating condition in the absence of the specific analyte. A first current, $I_1$, occurs at a gate voltage of $V_1$ in the absence of the specific analyte. The dashed line in the graph 100 depicts a shift of the gate voltage vs. current characteristic curve when influenced by the presence of a low concentration of the specific analyte. A second current, $I_2$, which is lower than the first current $I_1$, occurs at the gate voltage of $V_1$ at a low concentration of the specific analyte. The dotted line in the graph 100 depicts a shift of the gate voltage vs. current characteristic curve when influenced by the presence of a high concentration presence of the specific analyte. A third current, $I_3$, occurs at the gate voltage of $V_1$, which is lower than the second current $I_2$ at a high concentration of the specific analyte. Thus, while providing a gate voltage of $V_1$, a measurement of current between the source and drain will indicate a concentration of the specific analyte present.

In an embodiment, the FET channel may include graphene or carbon nanotubes and the absorption of the analyte on the graphene or carbon nanotubes may influence the current vs gate voltage of the FET. The FET can be used as a sensor by measuring current at a specific gate voltage. The dashed line and the dotted line in the graph 100 each depict a shift of the current characteristic vs. the gate voltage curve when influenced by a low and by a high concentration presence of a chemical molecule or an analyte.

Specifically, when the gate voltage is at $V_1$ and the current measured is $I_1$, this indicates that there is no amount of analyte present. When the gate voltage is at $V_1$ and the current measured is $I_2$, then there is a low amount of analyte present. When the gate voltage is at $V_1$ and the current measured is $I_3$, then there is a high amount of analyte present.

The function of gate voltage vs. current changes with a concentration of the analyte present. In this manner, a determination may be made as to the concentration of the analyte at a specific voltage difference between the source and the drain.

The graphene or carbon nanotubes can affect an electrical characteristic as demonstrated in FIG. 1. Surface functionalization can be done to the graphene or carbon nanotubes, such that they are sensitized to absorb a specific analyte by addition of other molecules to the nanotubes. The presence of a specific analyte will affect a conductive property of the graphene or carbon nanotube. In this manner, the graphene or carbon nanotubes can be used as medical or environmental sensors. The current property will be different in the graphene or carbon nanotubes depending on the absence or concentration of the specific analyte. In an embodiment, graphene or carbon nanotubes can be made as a channel between a source and a drain of an FET.

In an embodiment, an analyte may be an acidic gas, such as Hydrogen Chloride (HCl), glucose, carbon monoxide or an explosive gas.

In an alternate embodiment, a current between a source and a drain for a specific gate voltage for the FET with a plasmonic resonator may be higher than the current between the source and the drain for the specific gate voltage for the FET without a plasmonic resonator.

Figure 2:
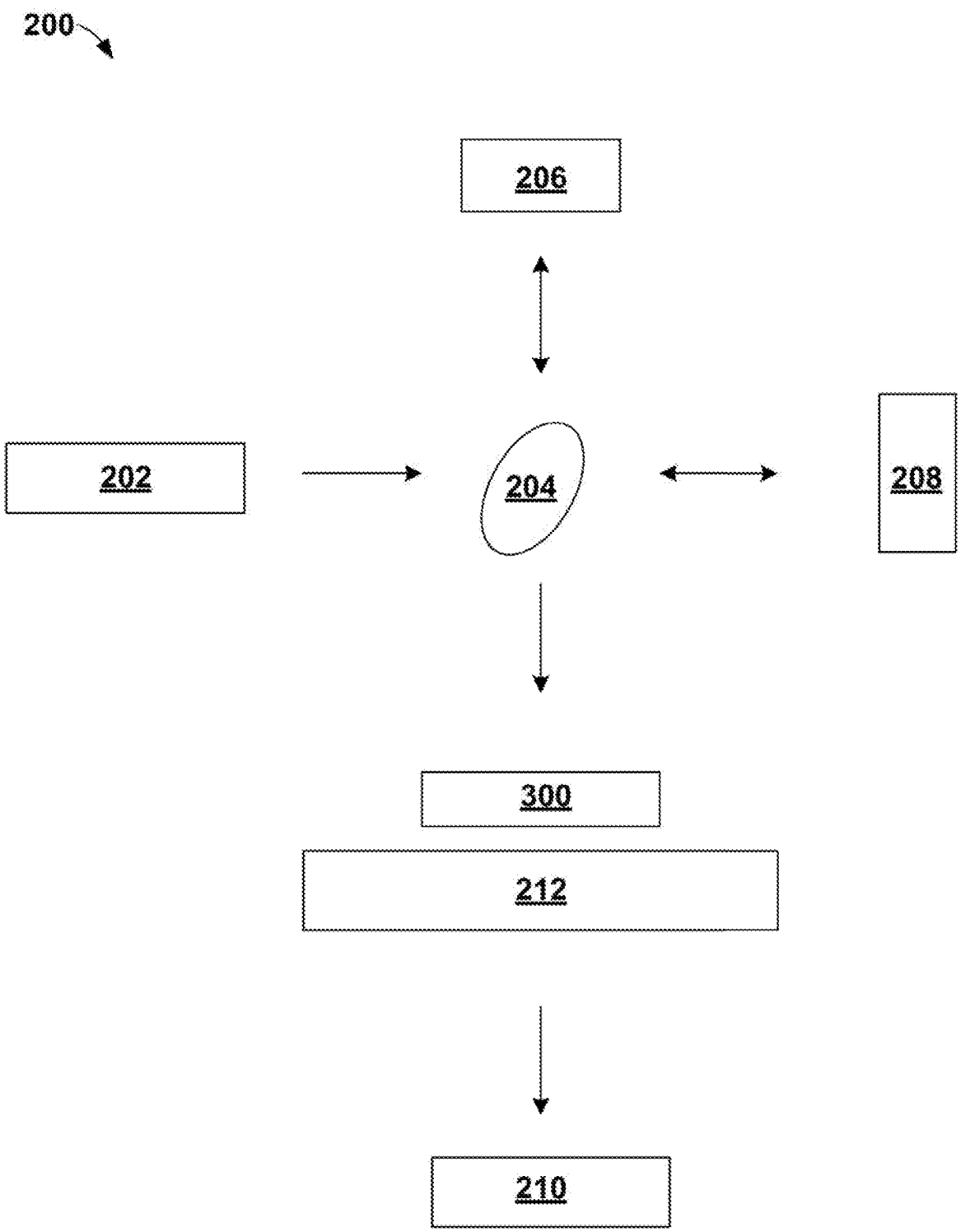
FIG. 2 illustrates a block diagram of components of a Fourier-transform infrared spectrometer, according to an embodiment.

Referring now to FIG. 2, a block diagram of a Fourier-transform infrared (hereinafter "FTIR") spectrometer 200 is shown, according to an embodiment. The FTIR spectrometer 200 is an optical sensor and includes a broadband light source 202, a beam splitter 204, a first mirror 206, a second mirror 208, a mounting surface 212 for a device under test (hereinafter "DUT") 300, and a detector 210. As described above, the broadband light source 202 transmits light to the beam splitter 204, which diverts the light to both the first mirror 206 and the second mirror 208. The first mirror 206 and the second mirror 208 reflects light back to the beam splitter 204. The beam splitter 204 directs light to the DUT 300 which is mounted on the mounting surface 212. The detector 210 measures a range of wavelengths in the infrared region that are absorbed by the DUT 300, identifying whether an analyte is present in the DUT 300. The detector 210 may include a computing device.

As described above, the FTIR can identify a concentration of an analyte present in the DUT 300.

Figure 3A:
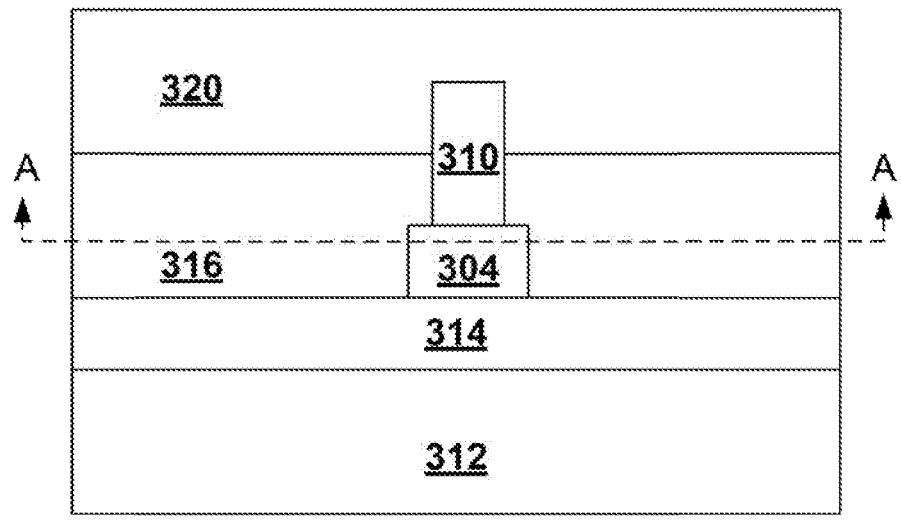
FIGS. 3A and 3B illustrate a cross-sectional view and a top view of a semiconductor, respectively, according to an embodiment.
Figure 3B:
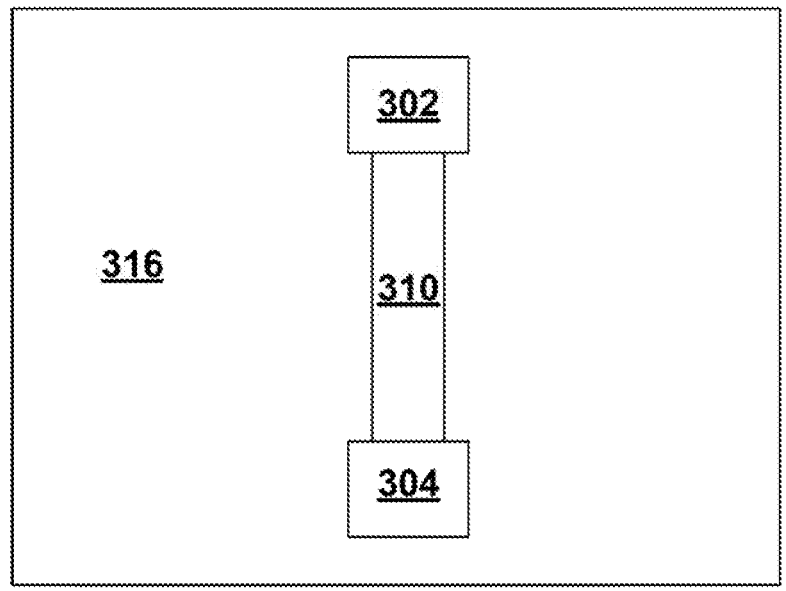

Referring now to FIGS. 3A and 3B, the DUT 300 is shown according to an embodiment. FIG. 3A is a cross sectional view of the DUT 300 and FIG. 3B is a top view of FIG. 3A along section line A-A. The DUT 300 may be a hybrid field effect transistor (hereinafter "FET"), which has been treated to detect specific molecules or analytes. The DUT 300 includes a source 302, a drain 304, a channel 310, a substrate 312, a dielectric 314, an insulator 316 and a top layer 320.

The DUT 300 may be fabricated using conventional FET methods, and is a hybrid due to a modification in the material and patterning of the channel 310, allowing the channel 310 to function as a plasmonic resonator which has been treated to detect specific molecules or analytes.

The substrate 312 may be made from any of several known semiconductor materials such as, for example, a silicon on insulator (SOI) wafer. Other non-limiting examples include bulk silicon, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the substrate 312 may be approximately, but is not limited to, several hundred microns thick. For example, the substrate 312 may include a thickness ranging from 0.5 mm to about 1.5 mm.

In an embodiment, the DUT 300 may be fabricated on the substrate 312 using existing fabrication techniques. The DUT 300 may be made, for example, in the conventional manner, with an open space which does not connect the source 302 and the drain 304 such that the channel 310 may be subsequently added after fabrication of the insulator or dielectric 316.

In an embodiment, the dielectrics 314 and 316 may include SiO$_2$, HfO$_2$, or other dielectric materials.

The channel 310 includes a plasmonic resonator which has been sensitized to absorb a specific analyte. The presence of a specific analyte will affect the electrical conductivity of the plasmonic resonator. In this manner, the plasmonic resonator can be used as a sensor. Conductive properties will be different in the plasmonic resonator depending on the presence or absence of the specific analyte. In this embodiment, the plasmonic resonator can be used as the channel 310, and serve as a gate between the source 302 and the drain 304.

The channel 310 may include silicon, graphene, gold, silver, carbon nanotubes, and metal oxides, among other materials. The channel 310 may be patterned during the semiconductor manufacturing process. This patterning process can take advantage of ordinary photolithography or electron-beam lithography. The channel material may first be deposited onto the substrate, a polymer resist will then be spun onto the substrate, followed by patterning of the resist through photo or electron-beam lithography. Next, dry or wet etching of the channel material in the undesired area is performed, and finally stripping of the resist.

As described above, graphene or carbon nanotubes can be treated, functionalized, or carbon engineered to detect specific molecules or analytes. In an embodiment, a plasmonic resonator which includes graphene or carbon nanotubes can be used as a sensor. The plasmonic resonator will have different conductive properties when it is exposed to the analyte versus when the plasmonic resonator is not exposed to the analyte. In another embodiment, a FET may include a graphene channel. The FET may have a different voltage threshold and current response depending on a voltage between the source and the drain when it is exposed to the analyte and a concentration of the analyte, versus when the FET is not exposed to the analyte.

In an embodiment, the top layer 320 may include a solution which is being tested for a concentration of the analyte, for example for testing of a blood sample for a medical test. The DUT 300 may have the channel 310 exposed to the solution and other components of the DUT 300 may be protected from the solution by the insulator 316. The solution may have the analyte dissolved in it. In this manner the plasmonic resonator of the channel 310 is exposed to the solution for determination of analyte concentration or an amount in the blood sample.

In an embodiment, the top layer 320 may be open air environment for environmental testing. The DUT 300 may have the channel 310 exposed to the solution and other components of the DUT 300 may be protected from the solution by the insulator 316. In this manner the plasmonic resonator of the channel 310 is exposed to an open air environment for determination if the analyte is present.

Figure 4A:
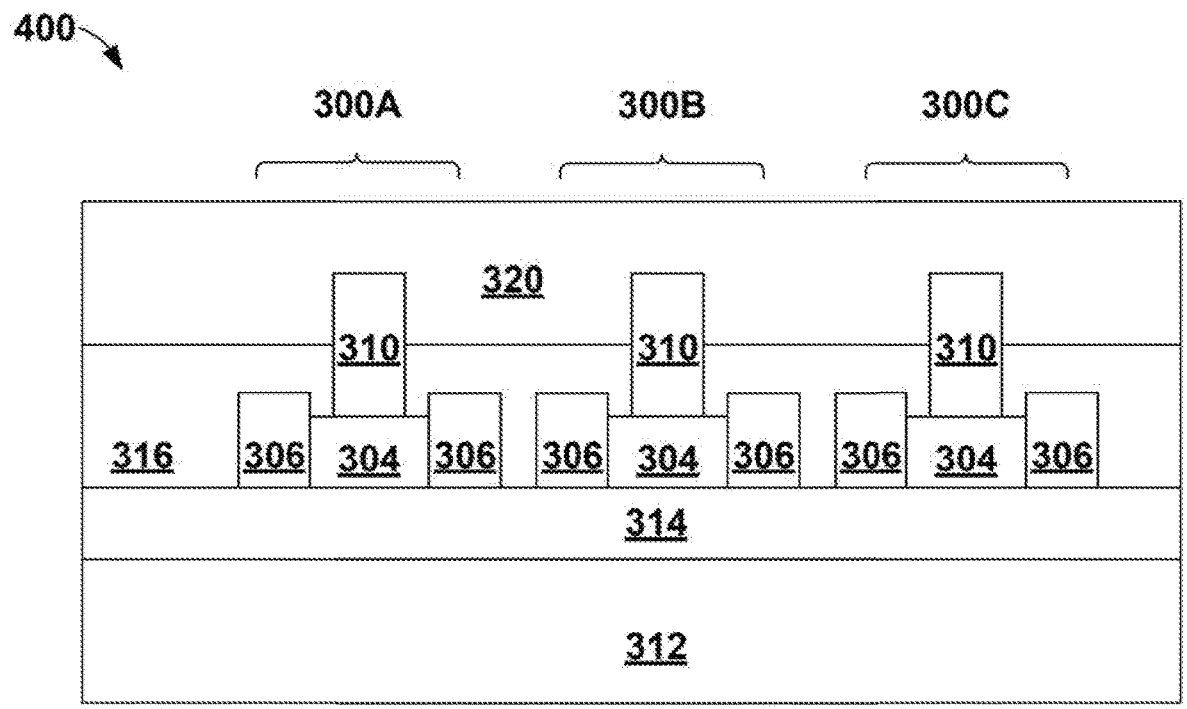
FIG. 4A illustrates a cross-sectional view of a semiconductor, according to an embodiment.

Referring now to FIG. 4A, a front view of a DUT 400 is shown, according to an embodiment. The DUT 400 may be essentially the same as the DUT 300, however the DUT 400 may include an array of FETs, including FET 300A, FET 300B, and FET 300C. Each FET of the array of FETs may have been configured to be a sensor for a different analyte, each engineered to perform as a plasmonic resonator when exposed to the specific analyte it was designed for.

In an embodiment, the top layer 320 may be exposed air, and each FET of the array of FETs may test for a different analyte.

Figure 4B:
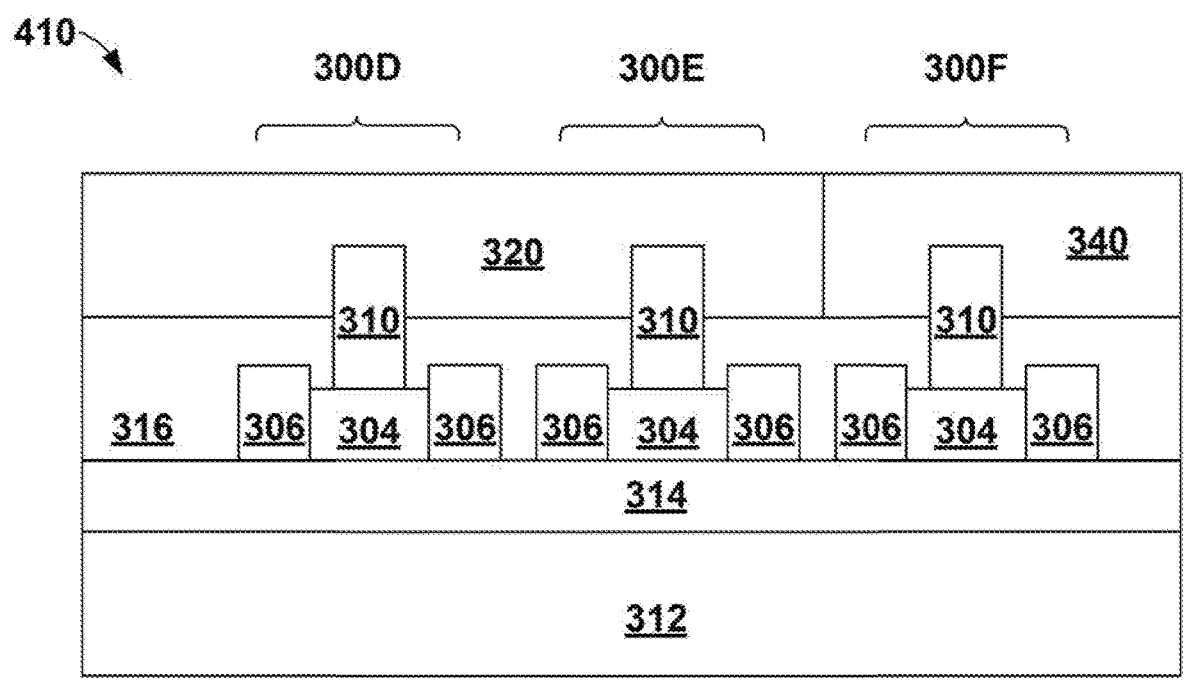
FIG. 4B illustrates a cross-sectional view of a semiconductor, according to an embodiment.

Referring now to FIG. 4B, a front view of a DUT 410 is shown, according to an embodiment. The DUT 410 may be essentially the same as the DUT 300, however the DUT 410 may include an array of FETs, including FET 300D, FET 300E, and FET 300F. In an embodiment, the top layer 320 may be exposed air, and the FET 300D and the FET 300E not exposed to air. The top layer 340 may be an insulator which covers the channel 310 of the FET 300F and may be used as a control FET which is not exposed to the air.

In an embodiment, each of the array of FETs may have been configured to be a sensor for a different analyte, each engineered to perform as a plasmonic resonator when exposed to the specific analyte it was designed for.

In an alternate embodiment, the FET 300D, the FET 300E and the FET 300F may be engineered to perform as a plasmonic resonator for the same analyte, and the use of duplicate FETs and a control FET may be used to confirm a concentration and a presence of the analyte.

In an embodiment, the DUT 410 may include a combination of control plasmonic resonator FETs which are not exposed to any analytes, and a combination of duplicate plasmonic resonator FETs or unique plasmonic resonator FETs which are exposed to possible analytes, either in open air or in a solution.

In an embodiment, the array may contain several thousand FETs.

Figure 5:
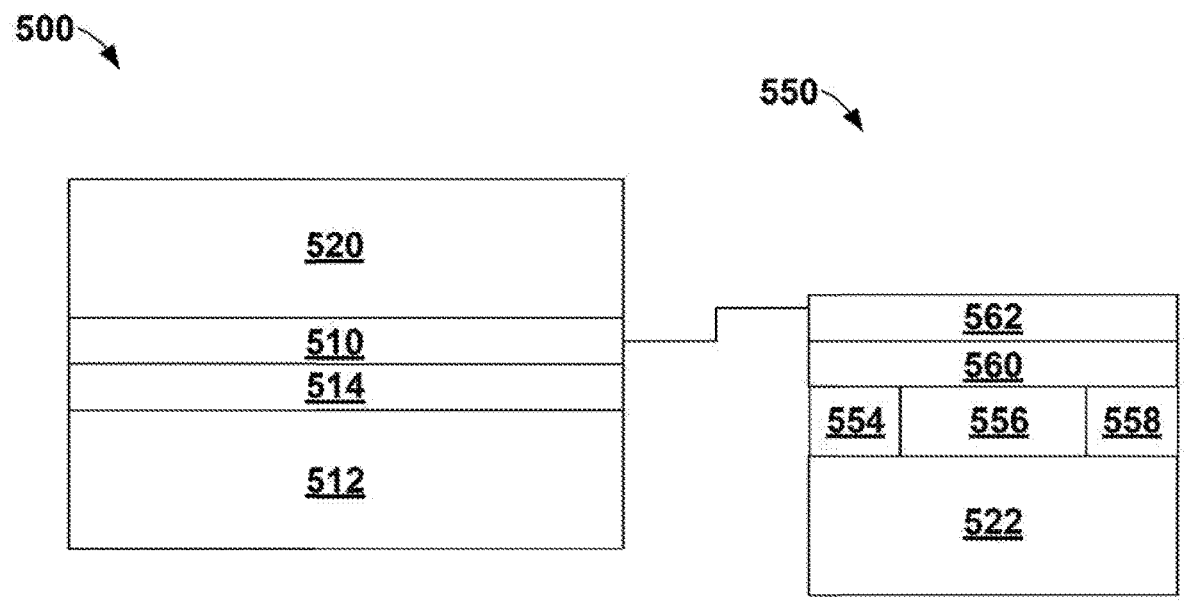
FIG. 5 illustrates a cross-sectional view of a semiconductor, according to an embodiment.

Referring now to FIG. 5, a device under test (hereinafter "DUT") 500 and a field effect transistor (hereinafter "FET") 550 are shown according to an embodiment. FIG. 5 illustrates a cross sectional view of the DUT 500 and a cross sectional view of the FET 550. The DUT 500 together with the FET 550 may be an alternate embodiment for a device used to detect specific molecules or analytes.

The DUT 500 includes a substrate 512, a dielectric 514, a plasmonic film 510 and a top layer 520. The FET 550 includes a substrate 552, a source 554, a silicon layer 556, a drain 558, a gate dielectric 560 and a gate 562. Similarly named components of the DUT 500 and the FET 550 may have the same function and be formed and include the same materials as components of the DUT 300. The plasmonic film 510 is physically and electrically connected to the gate 562 of the FET 550.

The plasmonic film 510 may function as a plasmonic resonator and may have been sensitized to absorb a specific analyte, as described previously in regards to the channel 310 of the DUT 300. The plasmonic film 510 may include silicon, graphene, gold, silver, carbon nanotubes, and metal oxides, among other materials.

The FET 550 may be fabricated using conventional methods. The plasmonic film 510 is conducting and forms a common sensing surface for both the optical sensor, i.e. the FTIR spectrometer 200, and the electronic sensor i.e., measurement of a voltage threshold and current of the FET 550 as a voltage increases between the source 554 and the drain 558.

The plasmonic film 510 is in contact with the top layer 520. In an embodiment, the top layer 520 may include a solution which is being tested for a concentration of the analyte, for example for testing of a blood sample for a medical test. The DUT 500 may have the plasmonic film 510 exposed to the solution which may have the analyte dissolved in it.

In an embodiment, the top layer 320 may be open air environment for environmental testing.

Advantages to having the FET 550 electrically connected and not physically residing within the FTIR 200 may include having one plasmonic film 510 connected to more than one FET 550. The plasmonic film 510 may be connected to a group of two or more FETs 550. Each FET of the group of two or more FETs 550 may be sensitized to a specific analyte, or may be used as a duplicate to improve result accuracy, or may be a control FET 550 which is not connected to the plasmonic film 510.

Figure 6:
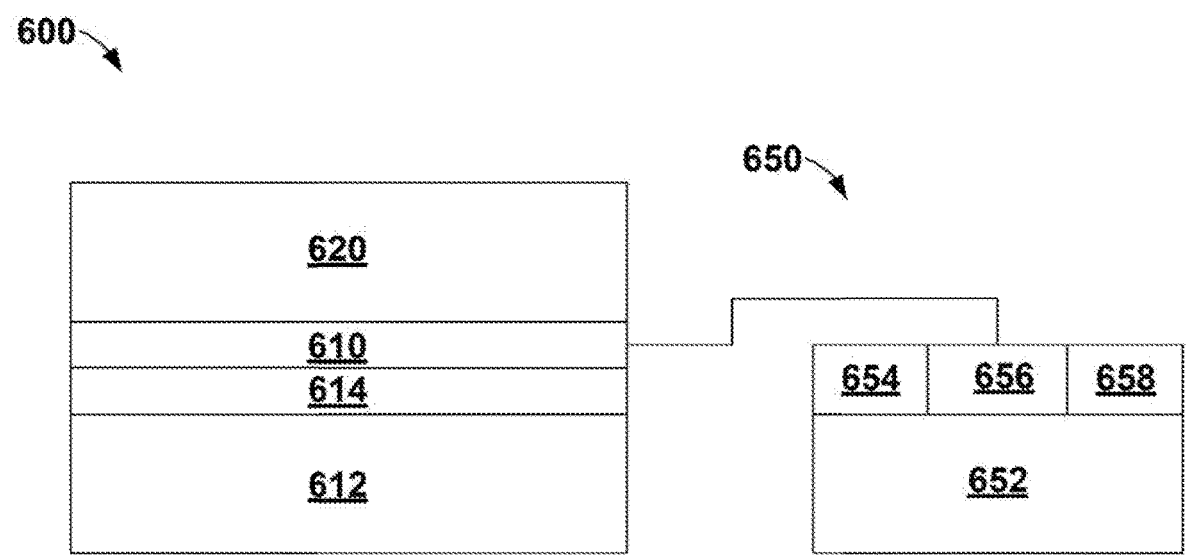
FIG. 6 illustrates a cross-sectional view of a semiconductor, according to an embodiment.

Referring now to FIG. 6, a device under test (hereinafter "DUT") 600 and a bipolar junction transistor (hereinafter "BJT") 650 are shown according to an embodiment. FIG. 6 illustrates a cross sectional view of the DUT 600 and a cross sectional view of the BJT 650. The DUT 600 together with the BJT 650 may be an alternate embodiment for a device used to detect specific molecules or analytes.

The DUT 600 includes a substrate 612, a dielectric 614, a plasmonic film 610 and a top layer 620. The BJT 650 includes a substrate 652, an emitter 654, a base 656 and a collector 658. Similarly named components of the DUT 600 and the BJT 650 may have the same function and be formed and include the same materials as components of the DUT 300. The plasmonic film 610 may be physically and electrically connected to the base 656 of the BJT 650.

The plasmonic film 610 may function as a plasmonic resonator and may have been sensitized to absorb a specific analyte, as described previously in regards to the channel 310 of the DUT 300. The plasmonic film 610 may include silicon, graphene, gold, silver, carbon nanotubes, and metal oxides, among other materials.

The BJT 650 may be fabricated using conventional methods.

The plasmonic film 610 is conducting and forms a common sensing surface for both the optical sensor, i.e. the FTIR spectrometer 200, and the electronic sensor i.e., measurement of collector current of the BJT 650 as emitter 654 voltage changes, while collector 658 voltage and base 656 voltage are both held constant.

The plasmonic film 610 is in contact with the top layer 620. In an embodiment, the top layer 620 may include a solution which is being tested for a concentration of the analyte, for example for testing of a blood sample for a medical test. The DUT 600 may have the plasmonic film 610 exposed to the solution which may have the analyte dissolved in it.

In an embodiment, the top layer 620 may be open air environment for environmental testing.

Advantages to having the BJT 650 electrically connected and not physically residing within the FTIR 200 may include having one plasmonic film 610 connected to more than one BJT 650. The plasmonic film 610 may be connected to a group of two or more BJTs 650. Each BJT of the group of two or more BJTs 650 may be sensitized to a specific analyte, or may be used as a duplicate to improve result accuracy, or may be a control BJT 650 which is not connected to the plasmonic film 610.

Figure 7:
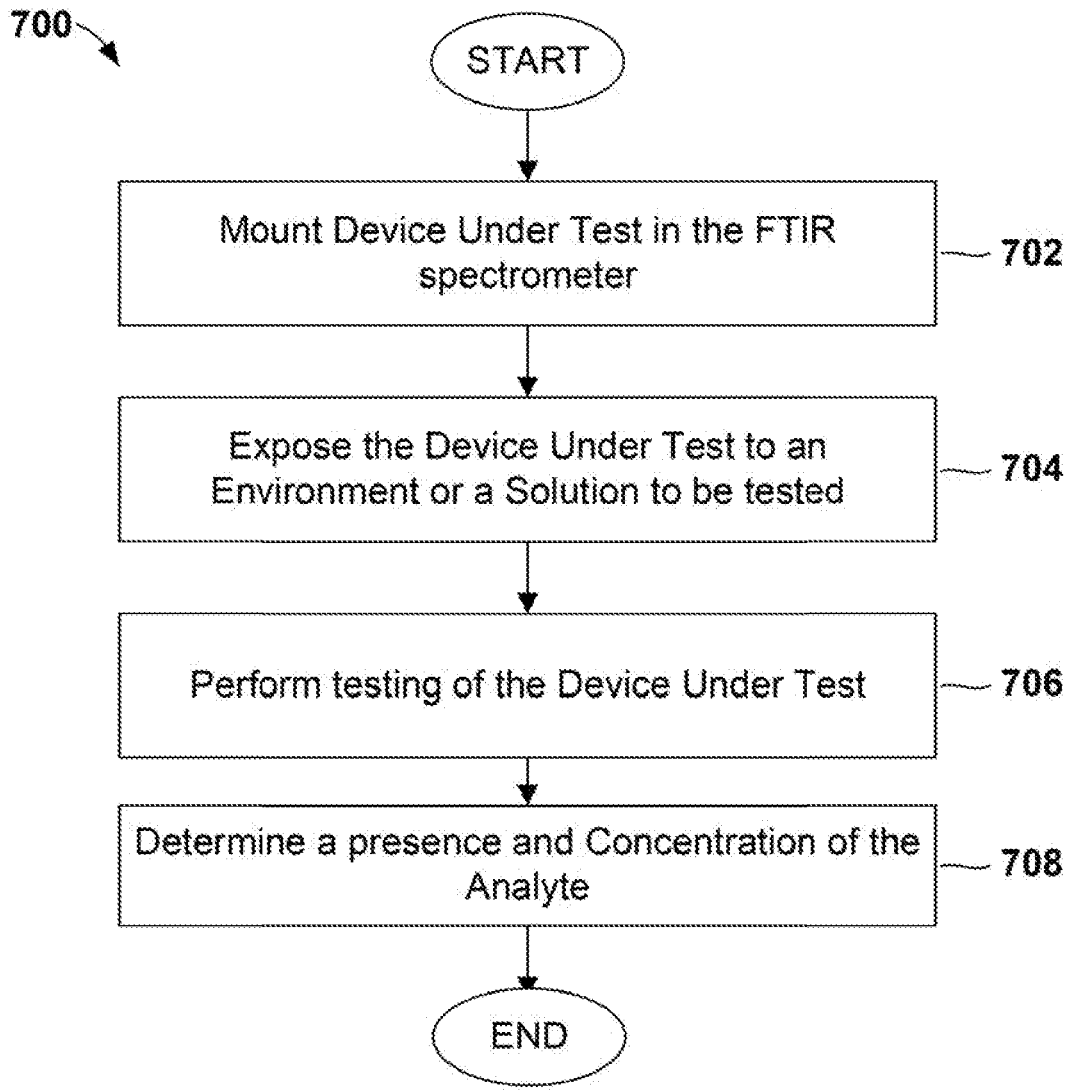
FIG. 7 illustrates a flowchart of a method of performing a sensing process, according to an embodiment.

Referring now to FIG. 7, an operational flowchart illustrating a sensing process 700 is depicted according to an embodiment. At 702, the device under test may be mounted in the FTIR spectrometer 200. The device under test may have been sensitized to react to a specific analyte via a plasmonic component.

Next, at 704, the device under test may be exposed to either air which may contain the specific analyte, or may be exposed to a solution contained a dissolved material which may contain the specific analyte.

At 706, testing may be performed on the device under test. Optical testing may include the FTIR spectrometer 200 testing. Electrical testing may include application of a voltage difference and a measurement of a voltage threshold and a resulting current at different voltage differences.

At 708, determination of a presence and a concentration of the specific analyte is determined. This is determined by the FTIR spectrometer 200 and the electrical testing.

A semiconductor device may be specifically formed such that the semiconductor device has a channel or a gate element which is a conductive material that can be used as a plasmonic material. The plasmonic material may be chemically specified to a specific analyte and may be probed by the FTIR to determine a presence of the specific analyte. The plasmonic material also determines a voltage threshold and a current based on a voltage difference applied to the semiconductor device, which determines a presence of the specific analyte and a concentration of the specific analyte.

Figure 8:
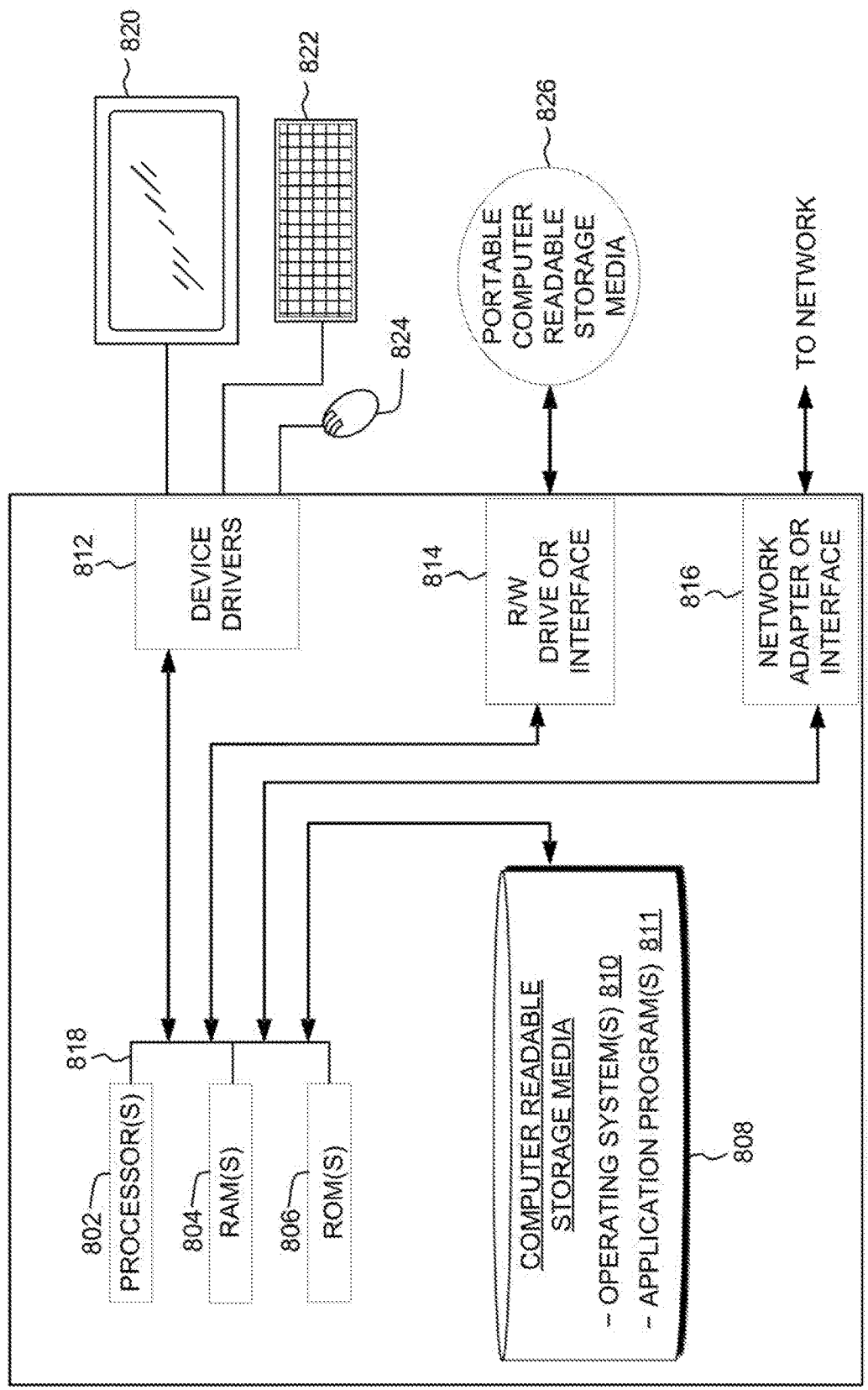
FIG. 8 illustrates a block diagram of internal and external components of computers and servers, according to an embodiment.

Referring now to FIG. 8, a block diagram of components of a computing device, such as the included in the detector 210 of the FTIR spectrometer 200, in accordance with an embodiment of the present invention is shown. It should be appreciated that FIG. 8, provides only an illustration of an implementation and does not imply any limitations with regard to the environments in which different embodiments may be implemented. Many modifications to the depicted environment may be made.

The computing device may include one or more processors 802, one or more computer-readable RAMs 804, one or more computer-readable ROMs 806, one or more computer readable storage media 808, device drivers 812, read/write drive or interface 814, network adapter or interface 816, all interconnected over a communications fabric 818. Communications fabric 818 may be implemented with any architecture designed for passing data and/or control information between processors (such as microprocessors, communications and network processors, etc.), system memory, peripheral devices, and any other hardware components within a system.

One or more operating systems 810, and one or more application programs 811 are stored on one or more of the computer readable storage media 808 for execution by one or more of the processors 802 via one or more of the respective RAMs 804 (which typically include cache memory). For example, the flow 700 for sensing a presence and a concentration of an analyte, may be stored on the one or more of the computer readable storage media 808. In the illustrated embodiment, each of the computer readable storage media 808 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

The computing device may also include the R/W drive or interface 814 to read from and write to one or more portable computer readable storage media 826. Application programs 811 on the computing device may be stored on one or more of the portable computer readable storage media 826, read via the respective R/W drive or interface 814 and loaded into the respective computer readable storage media 808.

The computing device may also include the network adapter or interface 816, such as a TCP/IP adapter card or wireless communication adapter (such as a 4G wireless communication adapter using OFDMA technology). Application programs 811 may be downloaded to the computing device from an external computer or external storage device via a network (for example, the Internet, a local area network or other wide area network or wireless network) and network adapter or interface 816. From the network adapter or interface 816, the programs may be loaded onto computer readable storage media 808. The network may comprise copper wires, optical fibers, wireless transmission, routers, firewalls, switches, gateway computers and/or edge servers.

The computing device may also include a display screen 820, a keyboard or keypad 822, and a computer mouse or touchpad 824. Device drivers 812 interface to display screen 820 for imaging, to keyboard or keypad 822, to computer mouse or touchpad 824, and/or to display screen 820 for pressure sensing of alphanumeric character entry and user selections. The device drivers 812, R/W drive or interface 814 and network adapter or interface 816 may comprise hardware and software (stored on computer readable storage media 808 and/or ROM 806).

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access a normalized search engine or related data available in the cloud. For example, the normalized search engine could execute on a computing system in the cloud and execute normalized searches. In such a case, the normalized search engine could normalize a corpus of information and store an index of the normalizations at a storage location in the cloud. Doing so allows a user to access this information from any computing system attached to a network connected to the cloud (e.g., the Internet).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 9:
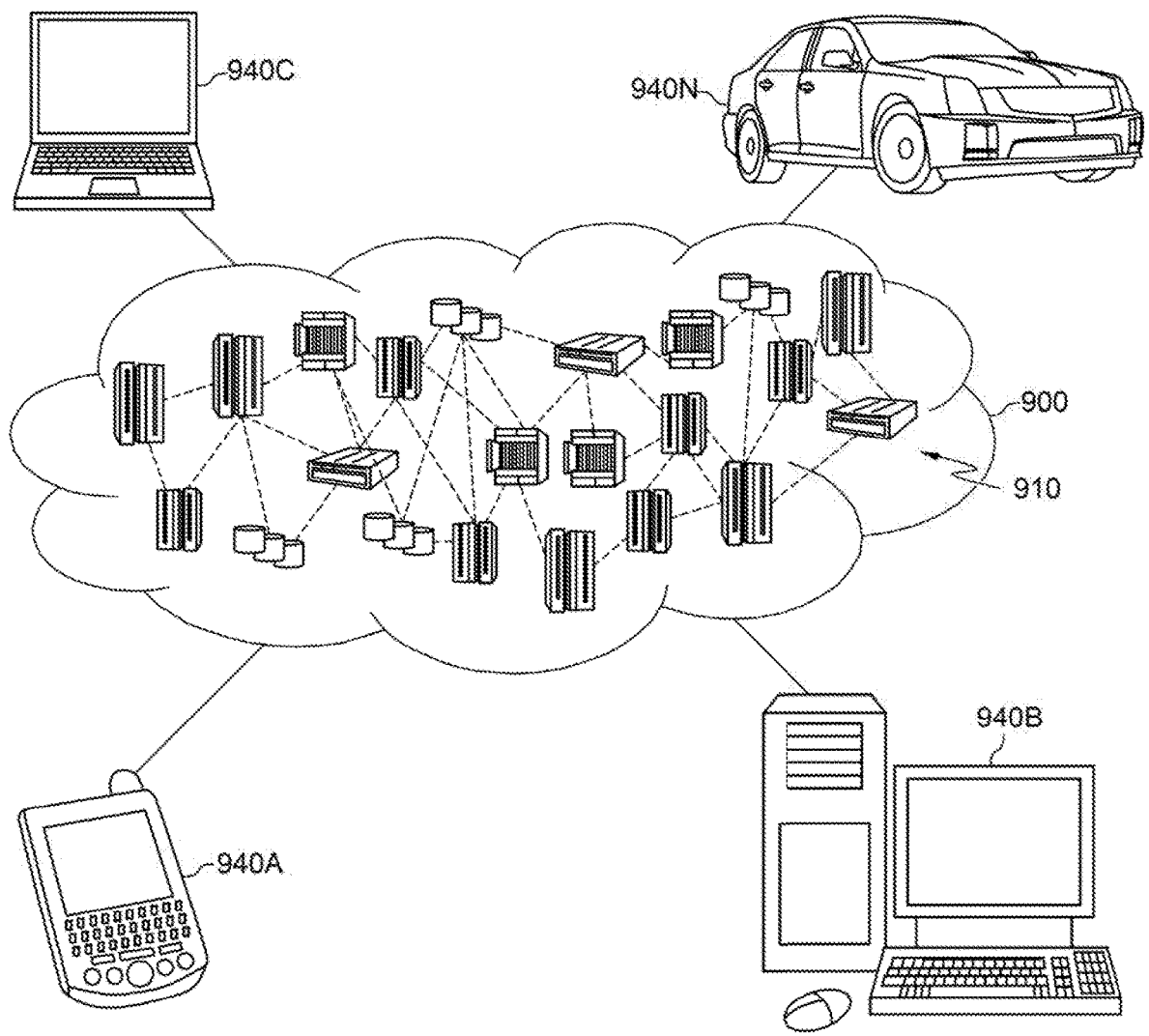
FIG. 9 illustrates a cloud computing environment, according to an embodiment.

Referring now to FIG. 9, illustrative cloud computing environment 900 is depicted. As shown, cloud computing environment 900 includes one or more cloud computing nodes 910 with which local computing devices used by cloud consumers, such as, for example, personal digital assistant (PDA) or cellular telephone 940A, desktop computer 940B, laptop computer 940C, and/or automobile computer system 940N may communicate. Cloud computing nodes 910 may communicate with one another. They may be grouped (not shown) physically or virtually, in one or more networks, such as Private, Community, Public, or Hybrid clouds as described hereinabove, or a combination thereof. This allows cloud computing environment 900 to offer infrastructure, platforms and/or software as services for which a cloud consumer does not need to maintain resources on a local computing device. It is understood that the types of computing devices 940A-N shown in FIG. 9 are intended to be illustrative only and that cloud computing nodes 910 and cloud computing environment 900 can communicate with any type of computerized device over any type of network and/or network addressable connection (e.g., using a web browser).

Figure 10:
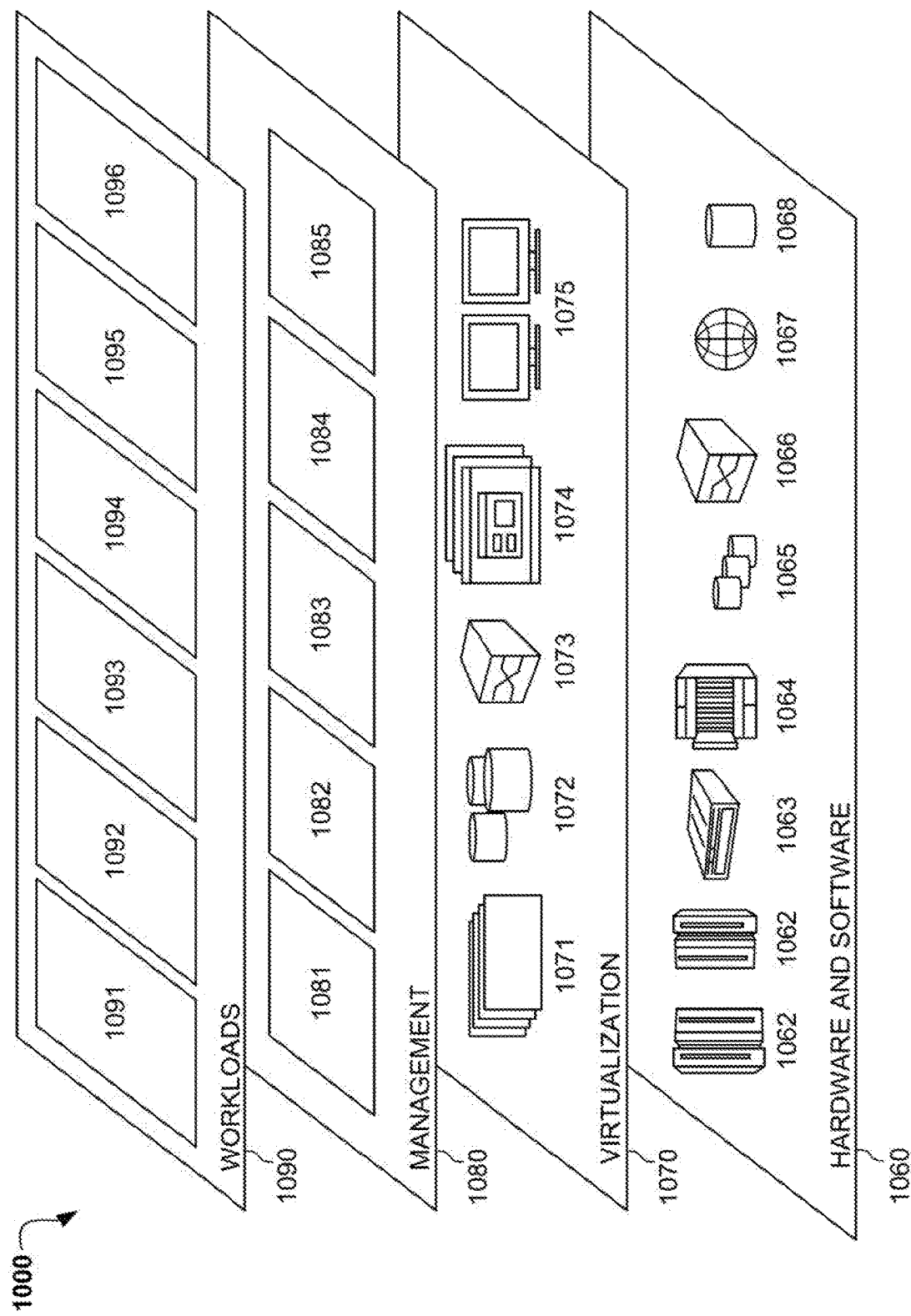
FIG. 10 illustrates abstraction model layers according to an embodiment of the present invention.

Referring now to FIG. 10, a set of functional abstraction layers provided by cloud computing environment 900 (as shown in FIG. 9) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 1060 includes hardware and software components. Examples of hardware components include: mainframes 1061; RISC (Reduced Instruction Set Computer) architecture based servers 1062; servers 1063; blade servers 1064; storage devices 865; and networks and networking components 1066. In some embodiments, software components include network application server software 1067 and database software 1068.

Virtualization layer 1070 provides an abstraction layer from which the following examples of virtual entities may be provided: virtual servers 1071; virtual storage 1072; virtual networks 1073, including virtual private networks; virtual applications and operating systems 1074; and virtual clients 1075.

In an example, management layer 1080 may provide the functions described below. Resource provisioning 1081 provides dynamic procurement of computing resources and other resources that are utilized to perform tasks within the cloud computing environment. Metering and Pricing 1082 provide cost tracking as resources are utilized within the cloud computing environment, and billing or invoicing for consumption of these resources. In an example, these resources may include application software licenses. Security provides identity verification for cloud consumers and tasks, as well as protection for data and other resources. User portal 1083 provides access to the cloud computing environment for consumers and system administrators. Service level management 1084 provides cloud computing resource allocation and management such that required service levels are met. Service Level Agreement (SLA) planning and fulfillment 1085 provide pre-arrangement for, and procurement of, cloud computing resources for which a future requirement is anticipated in accordance with an SLA.

Workloads layer 1090 provides examples of functionality for which the cloud computing environment may be utilized. Examples of workloads and functions which may be provided from this layer include: mapping and navigation 1091; software development and lifecycle management 1092; virtual classroom education delivery 1093; data analytics processing 1094; transaction processing 1095; and sensor program 1096. The sensor program 1096 may relate to testing a device under test to determine a presence and concentration of an analyte.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a device under test, the device under test comprising a semiconductor substrate, a dielectric layer on the semiconductor substrate, a plasmonic film on the dielectric exposed to an open air environment for environmental testing, wherein the plasmonic film forms a common sensing surface for a Fourier-transform infrared spectrometer and for an electronic sensor; and
   a group of two or more bipolar junction transistors, each of the group of two or more bipolar junction transistors comprising an emitter, a collector and a base between the emitter and the collector, all on another semiconductor substrate, wherein each base of the group of two or more bipolar junction transistors comprises a sensitivity to another unique known analyte, wherein the plasmonic film of the device under test is electrically connected to each of the group of two or more bipolar junction transistors.

2. The structure according to claim 1, wherein the plasmonic film comprises a response in an infrared region.

3. The structure according to claim 1, wherein the plasmonic film comprises carbon.

4. The structure according to claim 1, wherein the plasmonic film comprises a sensitivity to a known analyte.

5. The structure according to claim 1,
   wherein for each of the group of two or more bipolar junction transistors, an associated electronic sensor is capable of measuring a change in a collector current as an emitter current changes while a collector voltage and base voltage are both held constant.

6. A structure comprising:
   a device under test, the device under test comprising a semiconductor substrate, a dielectric layer on the semiconductor substrate, a plasmonic film on the dielectric exposed to a solution which is being tested for a concentration of a known analyte, wherein the plasmonic film forms a common sensing surface for a Fourier-transform infrared spectrometer and for an electronic sensor; and
   a group of two or more bipolar junction transistors, each of the group of two or more bipolar junction transistors comprising an emitter, a collector and a base between the emitter and the collector, all on another semiconductor substrate, wherein each base of the group of two or more bipolar junction transistors comprises a sensitivity to another unique known analyte, wherein the plasmonic film of the device under test is electrically connected to each of the group of two or more bipolar junction transistors.

7. The structure according to claim 6, wherein the plasmonic film comprises a response in the infrared region.

8. The structure according to claim 6, wherein the plasmonic film comprises carbon.

9. The structure according to claim 6, wherein the plasmonic film comprises a sensitivity to the known analyte.

10. The structure according to claim 6,
    wherein for each of the group of two or more bipolar junction transistors, an associated electronic sensor measures a change in a collector current as an emitter current changes while a collector voltage and base voltage are both held constant.

11. A method of forming a sensor comprising:
    forming a device under test, forming the device under test comprising forming a dielectric layer on a semiconductor substrate, forming a plasmonic film on the dielectric, exposing the plasmonic film to an open air environment for environmental testing, wherein the plasmonic film forms a common sensing surface for a Fourier-transform infrared spectrometer and for an electronic sensor; and
    forming a group of two or more bipolar junction transistors, forming each of the group of two or more bipolar junction transistors comprising forming an emitter, a collector and a base between the emitter and the collector, all on another semiconductor substrate, wherein each base of the group of two or more bipolar junction transistors comprises a sensitivity to another unique known analyte, wherein the plasmonic film of the device under test is electrically connected to each of the group of two or more bipolar junction transistors.

12. The method according to claim 11, further comprising:
    sensitizing the plasmonic film to a known analyte.

13. The method according to claim 11, wherein the plasmonic film comprises a response in the infrared region.

14. The method according to claim 11, wherein the plasmonic film comprises carbon.

15. The method according to claim 11,
    wherein for each of the group of two or more bipolar junction transistors, an associated electronic sensor measures a change in a collector current as an emitter current changes while a collector voltage and base voltage are both held constant.

16. The method according to claim 11, further comprising:
    mounting the sensor in a Fourier-transform infrared ("FTIR") spectrometer; and
    determining a presence and a concentration of a known analyte.

17. The method according to claim 16, further comprising:
    wherein for each of the group of two or more bipolar junction transistors, an associated electronic sensor measures a change in a collector current as an emitter current changes while a collector voltage and base voltage are both held constant.

18. The method according to claim 16, further comprising:
    measuring an infrared response of the sensor.

19. The method according to claim 16, further comprising:
  mounting a second sensor in the FTIR spectrometer; and
  protecting the second sensor from the environment.

20. The method according to claim 16, further comprising:
  mounting an array of sensors in the FTIR spectrometer.

\* \* \* \* \*